(12) United States Patent
Carter

(10) Patent No.: US 7,902,869 B1
(45) Date of Patent: Mar. 8, 2011

(54) EXTENSIBLE THREE DIMENSIONAL CIRCUIT

(75) Inventor: Richard J. Carter, Los Altos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 12/771,135

(22) Filed: Apr. 30, 2010

(51) Int. Cl.
*H01L 25/00* (2006.01)
*H03K 19/177* (2006.01)
(52) U.S. Cl. .............................. 326/41; 326/39; 326/47
(58) Field of Classification Search .................. None
See application file for complete search history.

(56) References Cited

U.S. PATENT DOCUMENTS

| 4,667,308 | A | 5/1987 | Hayes et al. |
| 7,383,476 | B2 | 6/2008 | Crowley et al. |
| 7,839,169 | B2 * | 11/2010 | Murotake ..................... 326/47 |
| 2006/0240681 | A1 * | 10/2006 | Williams et al. ............. 438/800 |
| 2008/0310207 | A1 | 12/2008 | Tan et al. |
| 2009/0168480 | A1 | 7/2009 | Scheuerlein et al. |
| 2009/0262583 | A1 | 10/2009 | Lue |
| 2009/0269932 | A1 | 10/2009 | Chen et al. |

* cited by examiner

*Primary Examiner* — Anh Q Tran

(57) ABSTRACT

An extensible three dimensional circuit includes an access layer and crossbar arrays overlying the access layer. The crossbar arrays are formed from tiled mini-arrays of crossing lines and electrically accessed by the access layer. The crossing lines comprise at least one bundle of traveling lines, the at least one bundle of traveling lines moving through the circuit both laterally and vertically. Programmable crosspoint devices are disposed between the crossing lines.

15 Claims, 12 Drawing Sheets

EXTENSIBLE THREE DIMENSIONAL CIRCUIT

STATEMENT OF GOVERNMENT INTEREST

This invention has been made with government support under Contract No. HR0011-09-3-0001, awarded by the Defense Advanced Research Project Agency. The government has certain rights in the invention.

BACKGROUND

In the past decades, the semiconductor industry has been improving the performance and density of integrated circuits primarily by shrinking the size of the electronic elements within the circuits. However, a number of barriers are becoming evident which increase the difficulty of making further reduction to the size of these elements. One potential solution for increasing the performance and planar density of integrated circuits is to create three dimensional circuits which contain multiple layers of interconnected circuitry.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

Figure 1:
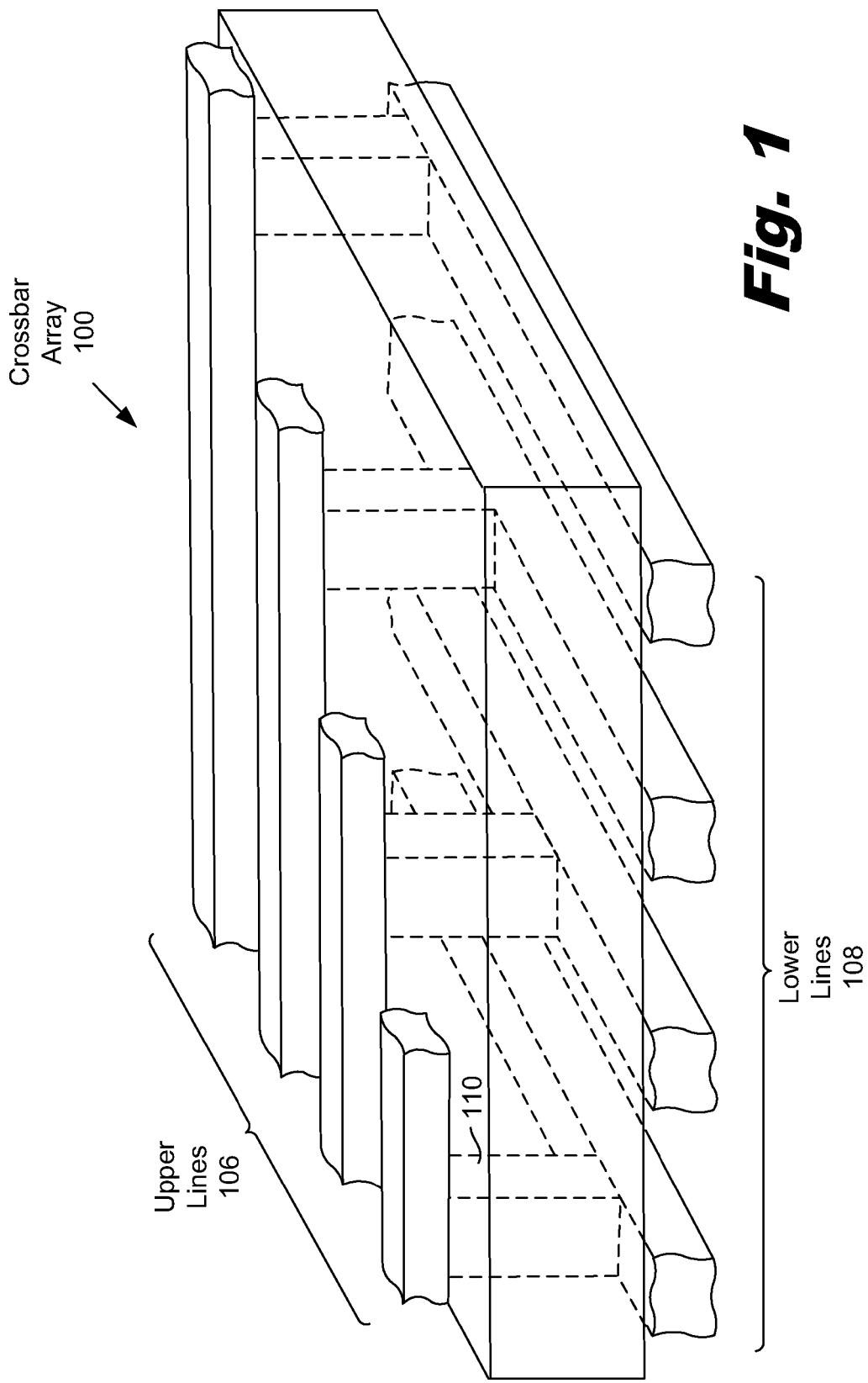
FIG. 1 is a perspective view of an illustrative crossbar array, according to one embodiment of principles described herein.

There are many metrics that can be used to evaluate three dimensional circuits, and many trade-offs that can be made between metric-affecting parameters in any given design. For example, extensibility, addressability, density, edge effects, active layer via spacing, and trace topology may all be metrics which are used to evaluate and optimize the performance of a three dimensional circuit. Specific examples of these metrics are given below for a multilayer three dimensional memory circuit.

Extensibility—What limits are there to the number of array layers in the three dimensional memory circuit?

Addressability—How easily can the system translate between the logical address of a memory element and the physical address of the control vias of that element?

Density—How well is each array layer utilized compared to a layer hypothetically populated with memory elements at maximum lithographic density? Is the design amenable to "double density" techniques in which memory elements are formed on both sides of a given metal trace?

Edge Effects—Is there wasted memory capacity at the periphery of the array layers or control issues with undriven traces? Do the edge effects disrupt the regular addressability of memory elements by the system?

Active Layer Via Spacing—Since the minimum feature size of the array layers may be less than that of the active drive-circuit layer, are the vias spaced out enough to be connected to by the active circuits?

Trace topology—Relating to issues of inductive and resistive voltage drops and electromigration, are the row and column lines single long snaking lines or are they pillars with many short trace stubs attached? Can the vias be "fattened" to address these concerns without excessively disrupting the density or other design parameters?

One challenge in designing and manufacturing three dimensional circuits is to find a balance between the relevant metrics. For example, some designs are extensible but have a fine-grained structure that make addressability and edge effect handling difficult. Other designs that are easily addressable with no edge effects have low limits to the number of array layers. The illustrative designs below describe solutions which balance the relevant metrics to produce three dimensional circuits which are extensible, mitigate the edge effects, and are easily addressable. Other metrics such as memory density, active layer spacing, and trace topology are also addressed.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

FIG. 1 is a diagram of an illustrative crossbar array (100). The crossbar array (100) includes upper crossbar lines (106) which are generally parallel. In this illustrative embodiment, a second group of lower crossbar lines (108) are substantially perpendicular to and cross the first group of lines (106). According to one illustrative embodiment, programmable crosspoint devices (110) are formed between crossing lines. The programmable crosspoint devices (110) may be configured in a variety of ways. For example, the programmable crosspoint devices (110) may be configured as programmable fuses or as part of a neural network. In some embodiments, the programmable crosspoint devices (110) may be configured as memory elements. The crossbar array (100) may include a variety of different types of programmable crosspoint devices (110) to accomplish its function. For example, a crossbar architecture can be used to form implication logic structures and crossbar based adaptive circuits such as artificial neural networks. The crossbar array (100), with its higher planar device density, has several advantages over conventional circuitry including higher capacity and/or smaller planar area.

As used in the specification and appended claims, a crossbar array includes a set of upper crossbar wires, a set of lower crossbar wires which cross the upper crossbar wires at a non-zero angle, and programmable crosspoint devices interposed between the wires at their crossing points.

According to one illustrative embodiment, the programmable crosspoint devices (110) are memristive devices. Memristive devices are described in U.S. Patent App. Pub. No. 2008/0079029, entitled "Multi-terminal Electrically Actuated Switch" and U.S. Patent App. Pub. No. 2008/009033, entitled "Electrically Actuated Switch", both to R. Stanley Williams, which are hereby incorporated in their entirety. Additionally or alternatively, the programmable crosspoint devices (110) may include memcapacitive devices. Various illustrative embodiments of memcapacitive devices are described in PCT Application No. PCT/US2009/047164 to Dmitri Strukov et al., entitled "Capacitive Crossbar Arrays" filed Jun. 12, 2009, which is incorporated by reference in its entirety.

Throughout the specifications and appended claims, the term "programmable crosspoint device" refers to a broad family of devices or technologies which provide the ability to program and sense state changes in devices which are interposed between crossing conductive elements. The term "memristive device" or "memristor" refers to a specific type of programmable crosspoint device which uses dopant motion within a matrix to alter the resistive state of the device.

Memristive devices exhibit a "memory" of past electrical conditions. For example, a memristive device may include a matrix material which contains mobile dopants. These dopants can be moved within a matrix to dynamically alter the electrical operation of an electrical device. The motion of dopants can be induced by the application of a programming electrical voltage across a suitable matrix. The programming voltage generates a relatively high electrical field through the memristive matrix and alters the distribution of dopants within the matrix. After removal of the electrical field, the location and characteristics of the dopants remain stable until the application of another programming electrical field. These changing dopant configurations within a matrix produce changes in the electrical resistance or other characteristics of the device.

The memristive device can be read by applying a lower reading voltage which allows the internal electrical resistance of the memristive device to be sensed but does not generate a high enough electrical field to cause significant dopant motion. According to one illustrative embodiment, the memristive device exhibits a rectifying behavior similar to Schottky diode. The state of the memristive device can be read by applying a full forward voltage bias across a specified junction while reverse biasing other memristive devices in the array to suppress leakage currents.

Each of the memristive crosspoint devices (110) may be used to represent one or more bits of data. For example, in the simplest case, memristive crosspoint devices (110) may have two states: a conductive state and a nonconductive state. The conductive state may represent a binary "1" and the nonconductive state may represent a binary "0", or vice versa. Binary data can be written into the crossbar array (100) by changing the conductive state of the memristive crosspoint devices (110). The binary data can then be retrieved by sensing the state of the memristive crosspoint devices (110). Additionally or alternatively, the crossbar array (100) can incorporate memristive crosspoint devices (110) which have more than two states.

There are a wide variety of interconnection architectures which can incorporate the illustrative principles described below. For example, PCT Application No. PCT/US2009/039666, to Dmitri Strukov et al., entitled "Three Dimensional Multilayer Circuit," filed Apr. 6, 2009, describes a three dimensional interconnection scheme and is incorporated by reference in its entirety. Additionally, various illustrative applications and examples of multilayer circuits which incorporate crossbar interconnections are given in "Nano/CMOS architectures using a field-programmable nanowire interconnect", Gregory Snider et al., Nanotechnology 18, 035204 (2007) which is incorporated by reference herein in its entirety.

For purposes of illustration, the following examples assume a three dimensional memory circuit which includes an access layer with area-distributed access gates. The connections are made between the access gates and the overlying crossbar layer by vertical vias. The access layer may have a number of different forms, including complementary metal-oxide-semiconductor (CMOS) or other conventional computer circuitry. This CMOS circuitry can provide additional functionality to the memristive device such as input/output functions, buffering, logic, or other functionality. In addition to the area distributed configuration illustrated, the principles described could also be applied to access layers with peripherally distributed access devices. Overlying the access layer are multiple crossbar array layers. A crossbar array layer includes two classes of parallel control lines that cross each other, with programmable crosspoint devices formed where pairs of control lines cross. To distinguish the two control line classes, they will be termed "row lines" and "column lines."

According to one illustrative embodiment, each array layer is organized as a regular grid of small rectangular (or square) memory arrays or "mini-arrays." Row and column control lines connect to control lines in overlying layers, in a manner that permits at least one of the row- or column-line classes to travel away from its original active circuit layer connection point. This traveling action enables a practically unbounded number of array layers by allowing each crosspoint device to be formed at the crossing of a unique row-line/column-line pair. Meanwhile, the regular grid organization of small rectangular arrays permits clean handling of edge effects through control line direction reversal and peripheral loopback signals. The regular grid organization and complete edge effect handling result in simple memory element addressability.

Figure 2:
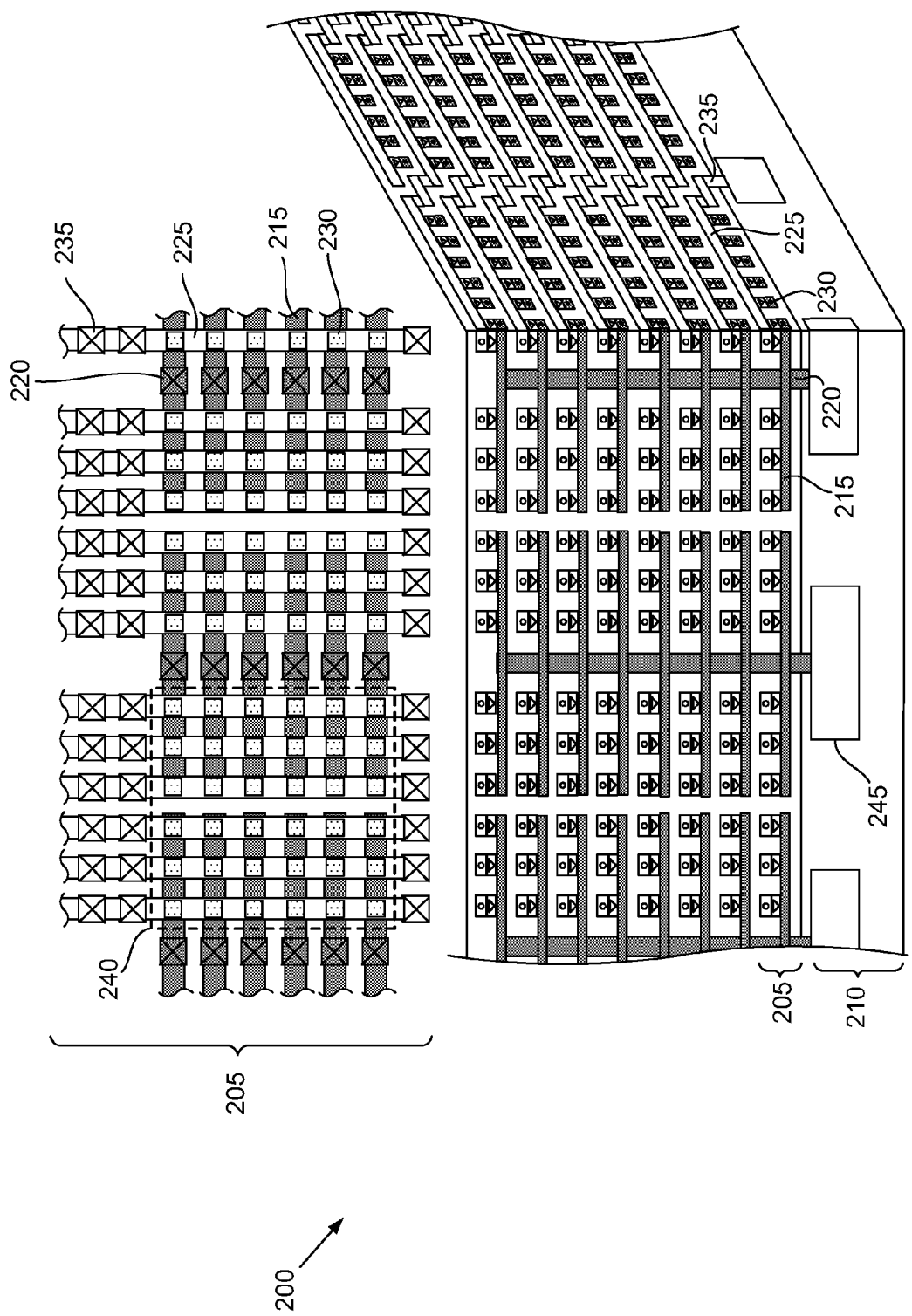
FIG. 2 is a diagram of an illustrative extensible three dimensional circuit with row line pillars and traveling column lines, according to one embodiment of principles described herein.

FIG. 2 is a diagram of an illustrative extensible three dimensional circuit (200). The upper portion of the diagram shows a plan view of a single array layer in the circuit (205). Similar to FIG. 1, the crossbar array in this layer (205) includes row lines (215) and column lines (225). Programmable crosspoint devices (230) are interposed between the row lines (215) and column lines (225) at their crossing points. To uniquely address the programmable crosspoint devices (230), unique row-line/column-line pairings are made for each programmable crosspoint device (230).

As discussed above, this circuit (200) includes many small rectangular (or square) fully connected "mini-arrays" (240) laid out in a larger rectangular grid. A number of these mini-arrays (240) can be tiled together to form the layer (205) within the three dimensional circuit (200). Because the three dimensional circuit (200) terminates along the edge of a row of mini-arrays (240), the three dimensional circuit (200) will have regular addressability and clean edge effects.

To connect the row and column lines (215, 225) to layers above and below the crossbar array (205), a number of vias (220, 235) can be used. The vias (220) associated with the row lines (215) are illustrated as shaded boxes which have a slightly larger cross section than the row lines. Similarly, the vias (235) associated with the column lines (225) are shown as unshaded boxes (235). The vias (220, 235) and the lines (215, 225) connected to the vias create conductive paths in the circuit (200).

The designation of row and column lines is arbitrary. For purposes of illustration, the shaded group of lines is designated as row lines (215) and the unshaded group of perpendicular lines is designated as column lines (225). The shaded row lines (215) and the unshaded column lines (225) may be illustrated as north-south or east-west within a given array layer and their orientation may vary from figure to figure.

The lower portion of FIG. 2 shows a cutaway perspective view of the three dimensional circuit. In this illustrative embodiment, the lower portion of the circuit is a CMOS layer (210) which includes gates (245) which selectively access conductive paths which travel through the three dimensional circuit (200). As can be seen in FIG. 2, the vias (220) which connect to the row lines (215) form a vertical pillar which extends vertically through the entire three dimensional circuit (200). However, the wiring path of the column lines (225) travel both laterally and vertically through the circuit (200) such that the column lines (225) encounter a new group of row lines (215) in each layer. This stair step path allows the CMOS gates (245) connected to the column conductive paths to uniquely address additional programmable crosspoint devices in each layer and provides multi-layer extensibility for the circuit. In some embodiments, the CMOS gates (245) may be significantly larger than the crossbar components. However, a number of additional layers can be added to the circuit and uniquely addressed with minimal interconnection overhead and without increasing the number of CMOS gates (245).

Figure 3:
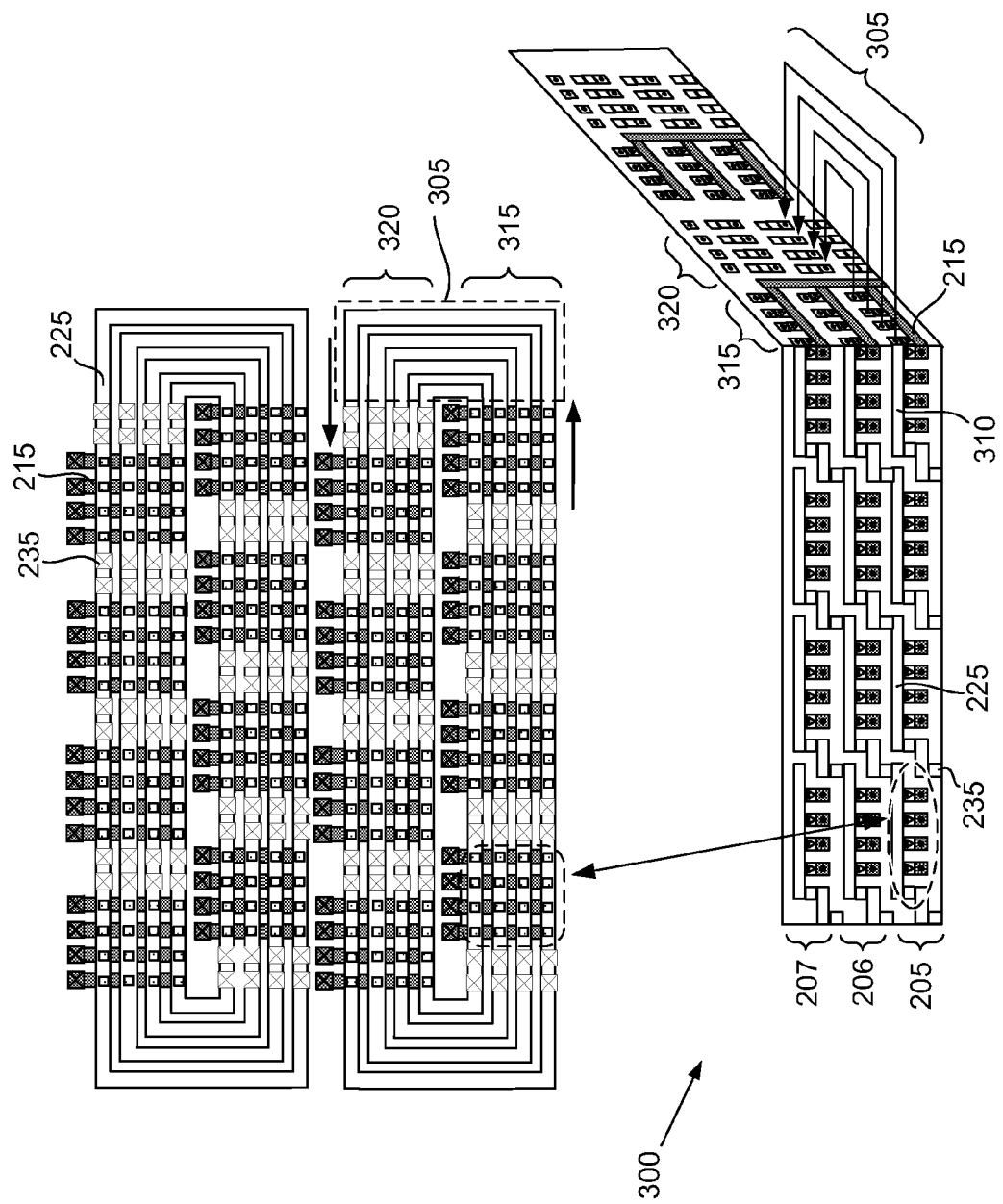
FIG. 3 is a diagram of illustrative loopback connections in an extensible three dimensional circuit, according to one embodiment of principles described herein.

An evaluation of the metrics for this three dimensional circuit is given below.
- Extensibility—practically unbounded (by this it is meant that the number of layers can grow until a row via shares a memory element with all other column vias, or until some electrical limitation is reached).
- Addressability—Fairly simple for practical numbers of layers.
- Density—If the "mini-array" size is N×N, then the density can be represented as $N^2/(N+1)(N+2)$, i.e. there are $N^2$ memory elements in a (N+1)×(N+2) grid. This is slightly lower than maximum density but improves with increasing N.
- Edge Effects—One unfortunate aspect of the traveling column lines is that, at the periphery of the circuit, there will be both undriven and underutilized column lines. A solution exists that involves alternating the direction of column line travel, coupled with providing loopback traces at the periphery. This technique is shown in FIG. 3 for a design quite similar to the design of FIG. 2.
- Active Layer Via Spacing—As shown in FIG. 2, the vias to the active circuit layer are in minimal-pitch rows, which might be difficult for the active circuits to connect to. Some partial solutions exist. First, realize that the row lines form the first layer of metal in the array layers. As such, the active circuit layers can "pop up" to connect to these traces at any point, including in an evenly distributed pattern. This is further described in FIG. 10. Second, column-line vias occupy two rows, and can connect to the bottom active circuit layer in a two-row zig-zag pattern if desired. Finally, if needed, a one-time translation layer can be inserted to bring an evenly distributed column-line via pattern into a minimal-pitch linear pattern, and this is shown for a related design in FIG. 4.

As discussed above, and in one embodiment of the invention, when traveling column lines (225) reach the periphery of circuit (200) they terminate, leaving undriven and underutilized lines. As discussed below, undriven lines are lines which are connected to programmable memory devices but are not connected to access circuitry. Underutilized lines are connected to access circuitry but lack a full complement of programmable memory devices. Both undriven and underutilized lines are caused by edge effects and can produce gaps in an otherwise uniform addressing scheme.

FIG. 3 is an illustrative embodiment of an extensible three dimensional circuit (300) which has alternative directions of column line (225) travel and utilizes loopback traces (305) at the periphery. This resolves the edge effect created by the termination of the column lines (225) at the periphery of the circuit by looping the column lines (225) back into the circuit (300).

To effectively loop the column lines (225) back into the circuit (300), the direction of travel for the column lines (225) alternates. In the bottom portion of FIG. 3, the traveling column lines (225) can be seen traveling upward and from the left to the right. When this group of column lines reaches the periphery of the circuit (300), they form emerging lines (315). These emerging lines (315) in most cases are underutilized in that they are not connected to a full complement of programmable crosspoint devices because they prematurely terminate at the edge of the circuit (300). In this example, the full complement of crosspoint devices is 12. However, the bottom-most emerging line (310) is underutilized because it is connected to only 4 crosspoint devices.

Adjacent to the group of emerging lines (315) is a group of undriven lines (320) which are traveling the opposite direction. The loopback traces (305) connect to the emerging lines (315) and loop back to connect these emerging lines (315) to the adjacent undriven lines (320). Undriven lines (320) are unusable because they have no connection to the underlying access gates. Combining the emerging lines (315) with the undriven lines (320) forms lines with a full complement of crosspoint devices. This resolves a number of issues, including eliminating gaps in the addressing scheme which are not useable and eliminating floating lines which may interfere with the operation of the circuit.

As the column lines (225) travel through the circuit, they step upward to connect with the next mini-array at a new level. Consequently, the path of the column lines (225) is similar to an ascending spiral or staircase. For purposes of illustration, the bottom portion of FIG. 3 shows only three layers (205, 206, 207). The circuit (300) may have any number of additional layers. The bottom-most portion of traveling column lines (225) begin in the bottom layer (205) and steps upward with each lateral move.

The upper portion of FIG. 3 shows a plan view of a single array layer of circuit (300) and depicts the race track shaped path that the traveling column lines take through successive layers of the circuit (300). On the lower portion of the race track shaped path, the column lines (225) travel from the left to the right and on the upper portion of the race track shaped path, they travel from right to left. This is shown by the black arrows just below and above the race track shaped path. Each mini-array that the traveling column lines (225) encounter is at new level. However, because the row lines (215) are stationary and connect to all layers with the same foot print, the column lines (225) cannot loop back to the point where they would encounter the same row lines (215) for a second time. In this illustrative example, consider the group of traveling column lines (225) surrounded by the dotted outline in the bottom layer (205). These traveling column lines encounter a first group of row lines (215) in bottom layer (205). The traveling column lines (225) then step up and encounter a different group of row lines (215) in the second layer (206) and a third group of row lines (215) in the third layer (207) and so on. After looping back and traveling from right to left through the circuit (300), the column lines (225) cannot continue around the race track through loop back traces (305) on the left because the column lines (225) would reencounter the row lines (215) in the dotted outline for the second time but eight layers higher in the circuit (300). Consequently, for this illustrative embodiment, the traveling column lines (225) pass through the circuit (300) only twice, once in each direction. This limits the extensibility of this illustrative design to 8 stacked crossbar arrays. Traveling column lines that start in a different mini-array than those discussed above might make use of both the left-side and right-side loop back traces (305), but would similarly be limited to eight layers before reencountering the same row lines (215).

In the specification and appended claims, the term "lateral" or "laterally" refers to a direction or position which is anywhere within a single circuit plane; the term "vertical" or "vertically" refers a direction or position which is up or down the stack of circuit planes which make up the three dimensional circuit. The term "pillar lines" refers to lines or groups of lines which travel vertically, but not laterally through a three dimensional circuit except into mini-arrays adjacent to the pillar. Pillar lines maintain the same vertical via footprint in all layers. The term "travelling lines" refers to lines or groups of lines which move both vertically and laterally through a three dimensional circuit. A three dimensional circuit may be comprised of all pillar lines, all traveling lines, or a combination of traveling and pillar lines. In this illustrative embodiment, at least a portion of the lines in the three dimensional circuit travel. For example, in FIG. 3 the shaded row lines are pillar lines and the unshaded column lines are traveling lines.

As discussed above, the size of the underlying CMOS access gates (FIG. 2, 245) may be significantly greater than the minimum feature size of the crossbar arrays. Consequently, the packing density of the CMOS access gates (FIG. 2, 245) and the access layer routing density can be a limiting factor in the overall density of the three dimensional circuit.

To achieve high packing densities, the CMOS access gates (FIG. 2, 245) can be uniformly distributed over the upper surface of the CMOS access layer (FIG. 2, 210). However, to form the mini-arrays, the vias which connect to the row and column lines may have a different and denser packing arrangement. A routing layer can then be used to connect each of the CMOS access gates (FIG. 2, 245) to the appropriate row or column via. This via then interconnects with other vias to address the programmable memory devices.

Figure 4:
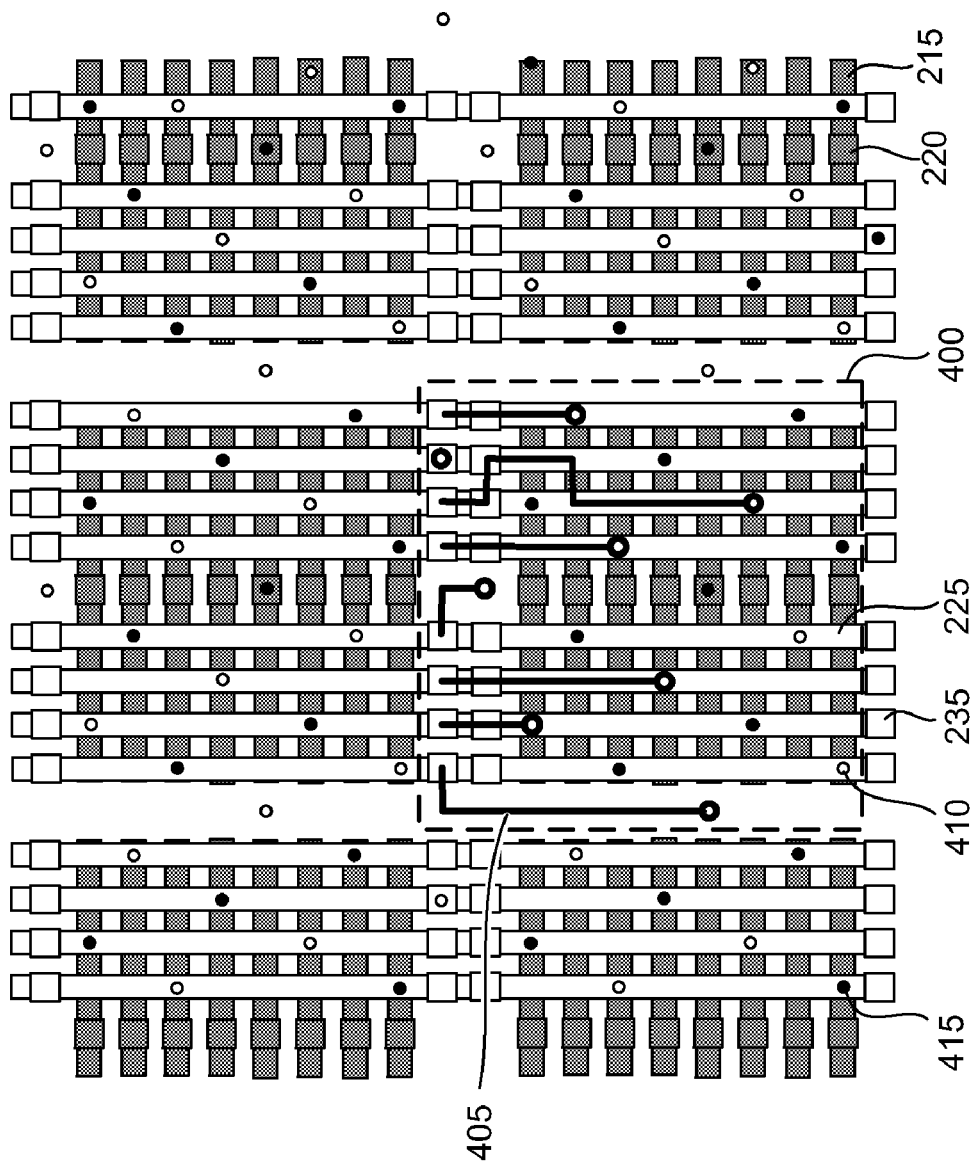
FIG. 4 is a diagram of an illustrative one-time translation layer in an extensible three dimensional circuit, according to one embodiment of principles described herein.

FIG. 4 is a diagram of an illustrative routing layer which connects area distributed CMOS gates to the appropriate vias in overlying crossbar arrays, superimposed on the row and column line traces of a first overlying array layer. For simplicity, only access vias extending upward from the CMOS gates are shown. Black circles represent access vias (415) which are configured to attach to the row or pillar lines (215) and open circles represent access vias (410) which are configured to attach to the traveling column lines (225). As is illustrated in FIG. 4, these access vias (410, 415) are distributed uniformly over the circuit area. This uniform distribution efficiently populates the space beneath the circuit with access circuitry. However, to form the mini-arrays, the vias (220, 235) which connect to the row and column lines (215, 220) are arranged in tightly packed rows. To connect the access vias (410, 415) to the column and row vias (220, 235) a one time wiring layer (400) can be used. In FIG. 4, only a portion of the wiring layer (400) is shown. This portion of the wiring layer (400) is surrounded by a dashed box and only shows connections from access vias (410) which are configured to drive the traveling column lines (225). The black lines represent the wired connections (405) between the access vias (410) and the column vias (235). As can be seen from FIG. 4, the wiring (405) may have a variety of configurations and routing paths. These routing paths can be adapted to a given design based on a number of criteria, including manufacturability and electrical criteria. Note that there are no routing traces required to connect area distributed gates to their respective row lines, because the row lines traces are in the layer immediately above the access circuitry and can be via-connected anywhere along their length.

Figure 5:
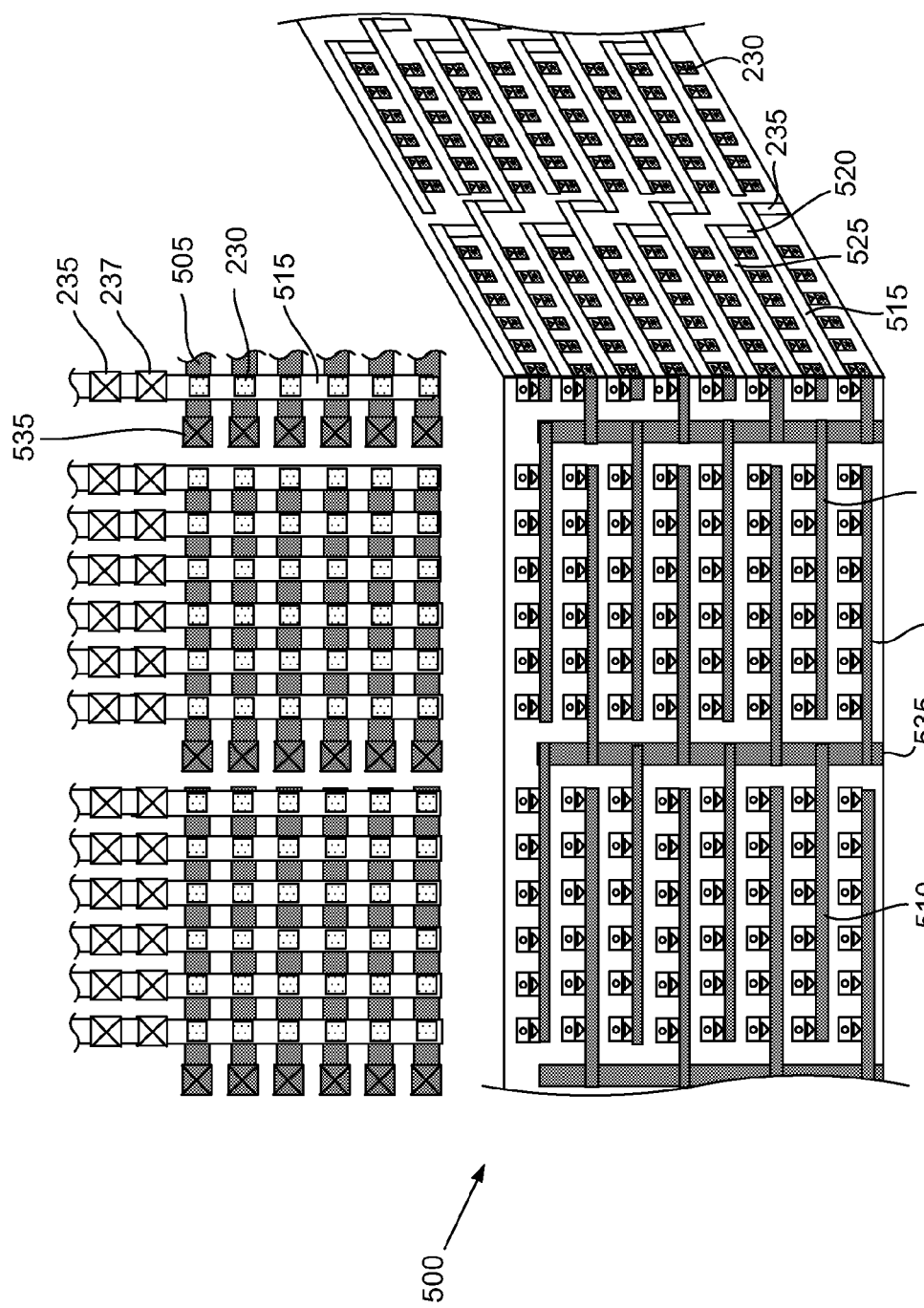
FIG. 5 is a diagram of an illustrative extensible three dimensional circuit with column lines which interconnect with two different sets of pillar lines before making the next upward jog through the circuit, according to one embodiment of principles described herein.

FIG. 5 is a diagram of an illustrative extensible three dimensional circuit (500) with traveling column lines (515) which interconnect with two different sets of pillar lines (505, 530) before making the next upward jog through the circuit (500). A major distinction of this design from the embodiment shown in FIG. 2 is the column line handling. While the column via topology is still that of a pillar (535) with many short row lines (505, 510, 530), the row lines extend out alternately in both directions, rather than in both directions simultaneously as before. The traveling column lines (515) thus interconnect with two layers within any given mini-array before moving on to the next mini-array footprint. For example, the traveling column lines split into an upper line (525) and a lower line (515). The upper column line (525) and lower column line (515) are connected by a via (520). The upper column line (525) interacts with a row line to the right and the lower column line (515) interacts with a row line to the left before the column line jogs upward.

Figure 6:
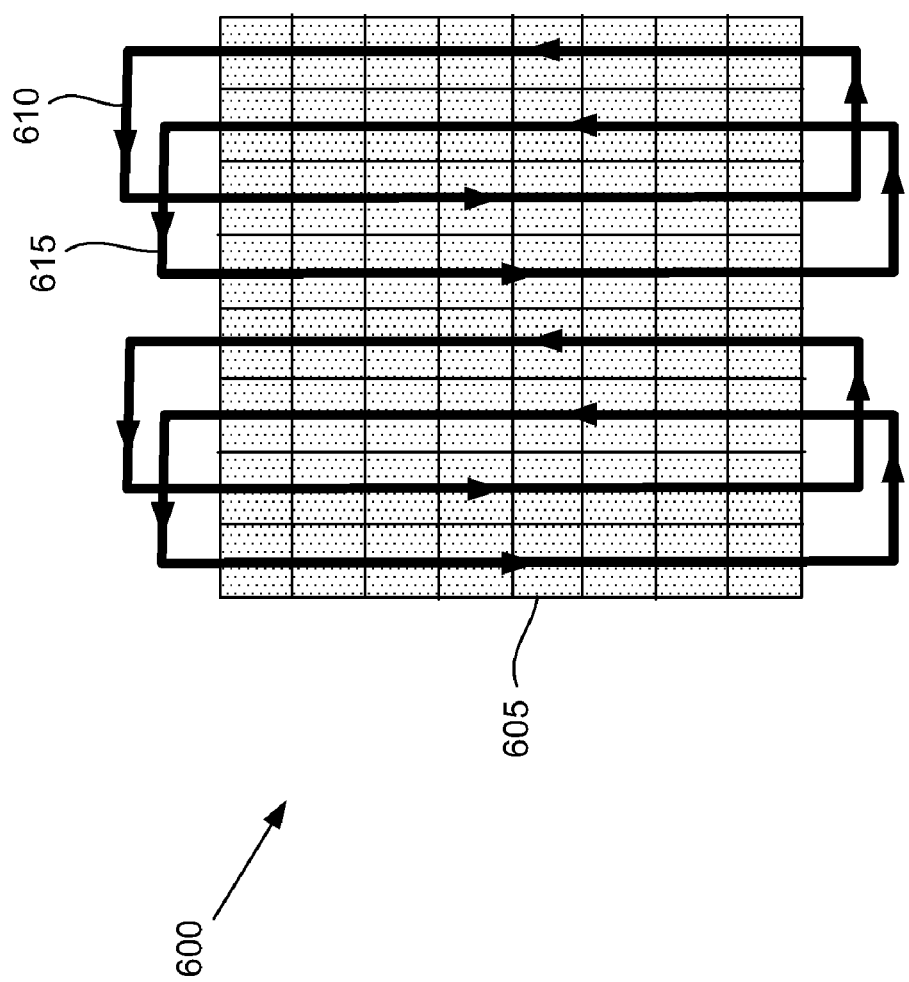
FIG. 6 is a diagram of illustrative overlapping loopback connections for an extensible three dimensional circuit, according to one embodiment of principles described herein.

Because the column lines (515, 525) share memory elements with row lines from both sides of the track they are traveling along, the edge effect handling is slightly different. FIG. 6 shows one illustrative embodiment for handling edge loopback traces (610, 615) for the architecture described in FIG. 5. The routing formed by the loopback traces (610, 615) is shown on a shaded grid (605) which represents the multi-layer circuit (600). Each square in the grid represents a footprint of a mini-array within the circuit. In this embodiment, the loopback traces (610, 615) form double overlapping loops. The loopback traces (610, 615) connect a first bundle of traveling lines moving a first direction to a nonadjacent bundle of traveling lines traveling in the opposite direction. This avoids reconnecting the traveling lines with pillar lines with which they have already interacted. In the example illustrated in FIG. 6, the traveling lines can move laterally and upward through the circuit for 16 layers before reencountering the same column lines.

Figure 7:
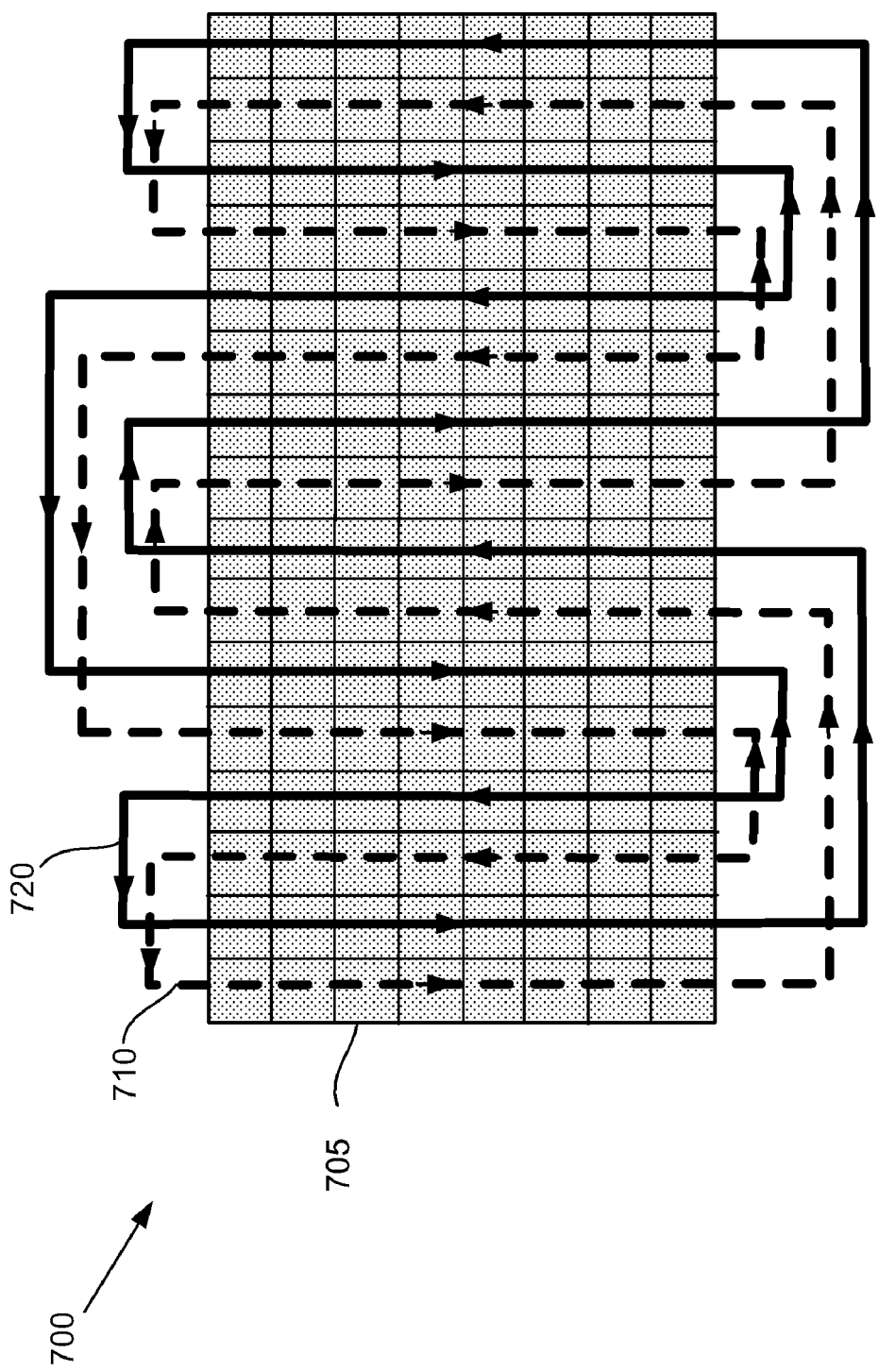
FIG. 7 is a diagram of illustrative double folded overlapping loop connections for an extensible three dimensional circuit, according to one embodiment of principles described herein.

While the loopback approach described in FIG. 6 can be sufficient for most practical choices of layer count, a loopback approach that achieves the optimal maximum is possible, as shown in FIG. 7. FIG. 7 shows an extensible multilayer circuit (700) which is represented by a grid (705) of mini-arrays. The loopback connections in this illustrative design form double overlapping folded loops (710, 720). Using the double-overlapping-folded-loop design, each of the traveling lines can interact with each of the stationary pillar lines, thereby achieving maximum interconnectivity between the traveling lines and the stationary lines. This increases the length of the traveling lines, but allows for unique and complete addressability.

As the length of the traveling lines increases, the electrical resistance of the traveling lines may also increase. To obtain the desired functionality, there may be design limits which define the maximum allowable electrical resistance of the lines. The pillar lines may have a relatively low resistance because of the short electrical path between the underlying access circuitry and any crosspoint device connected to the pillar lines. However, the traveling lines are much longer and may have a significantly higher resistance. This high resistance may be particularly limiting when a traveling line serves the role of a row line and carries the current of many fully-selected memory elements during a full-row read operation.

Figure 8:
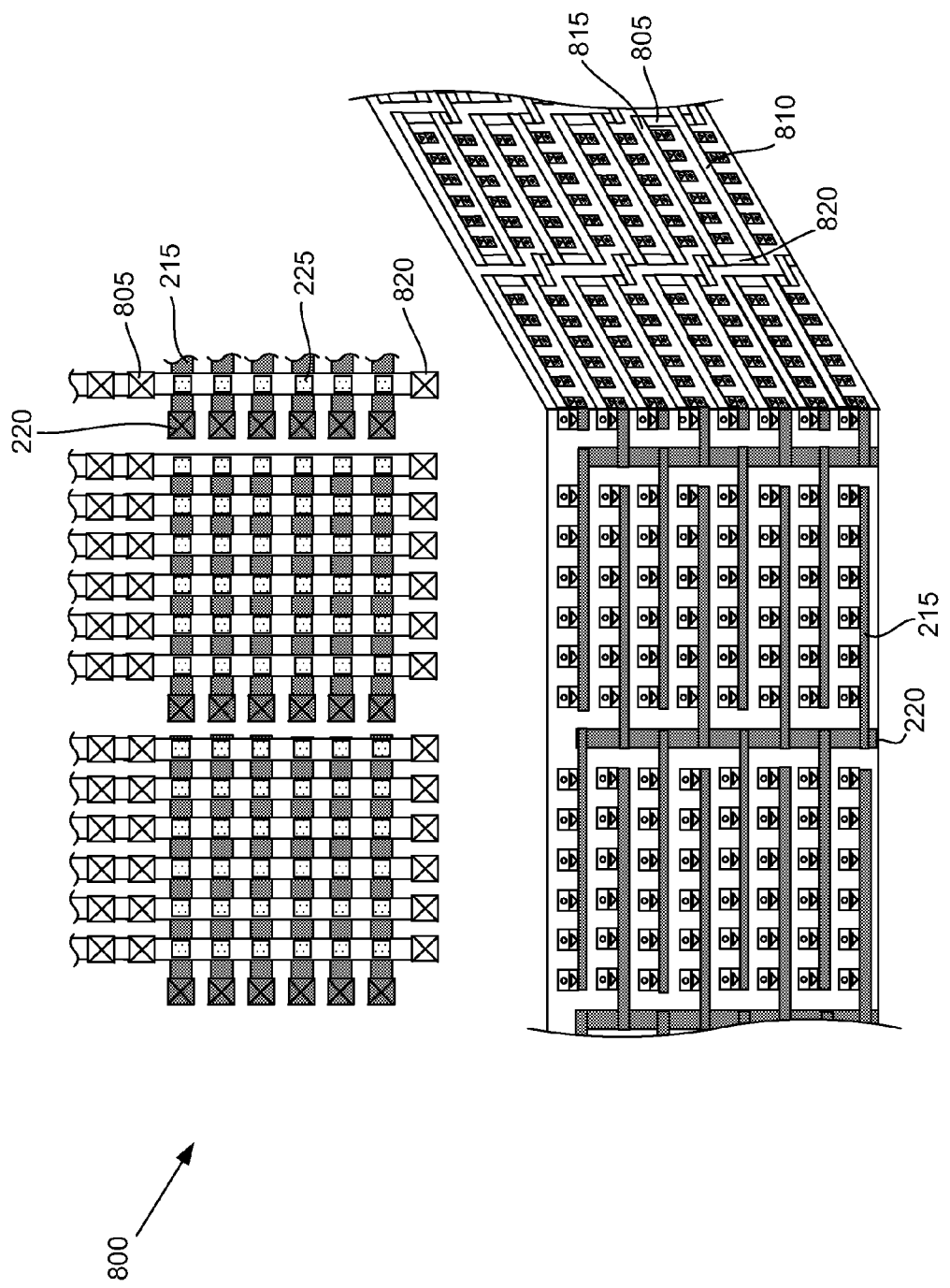
FIG. 8 is a diagram of an illustrative extensible three dimensional circuit, according to one embodiment of principles described herein.

FIG. 8 shows one method of reducing the resistance of the traveling lines by providing redundant electrical connections. In FIG. 8, the row lines (215) have a pillar configuration with alternating lines extending to the right and left. The traveling column lines (810, 815) reconnect periodically, to approximately halve the column-line resistance seen by the memory elements. For example, a bottom column line (810) can be connected at a first end to an upper column line (815) by a first via (805) and at a second end to the same upper column line (815) by a second via (820).

Figure 9:
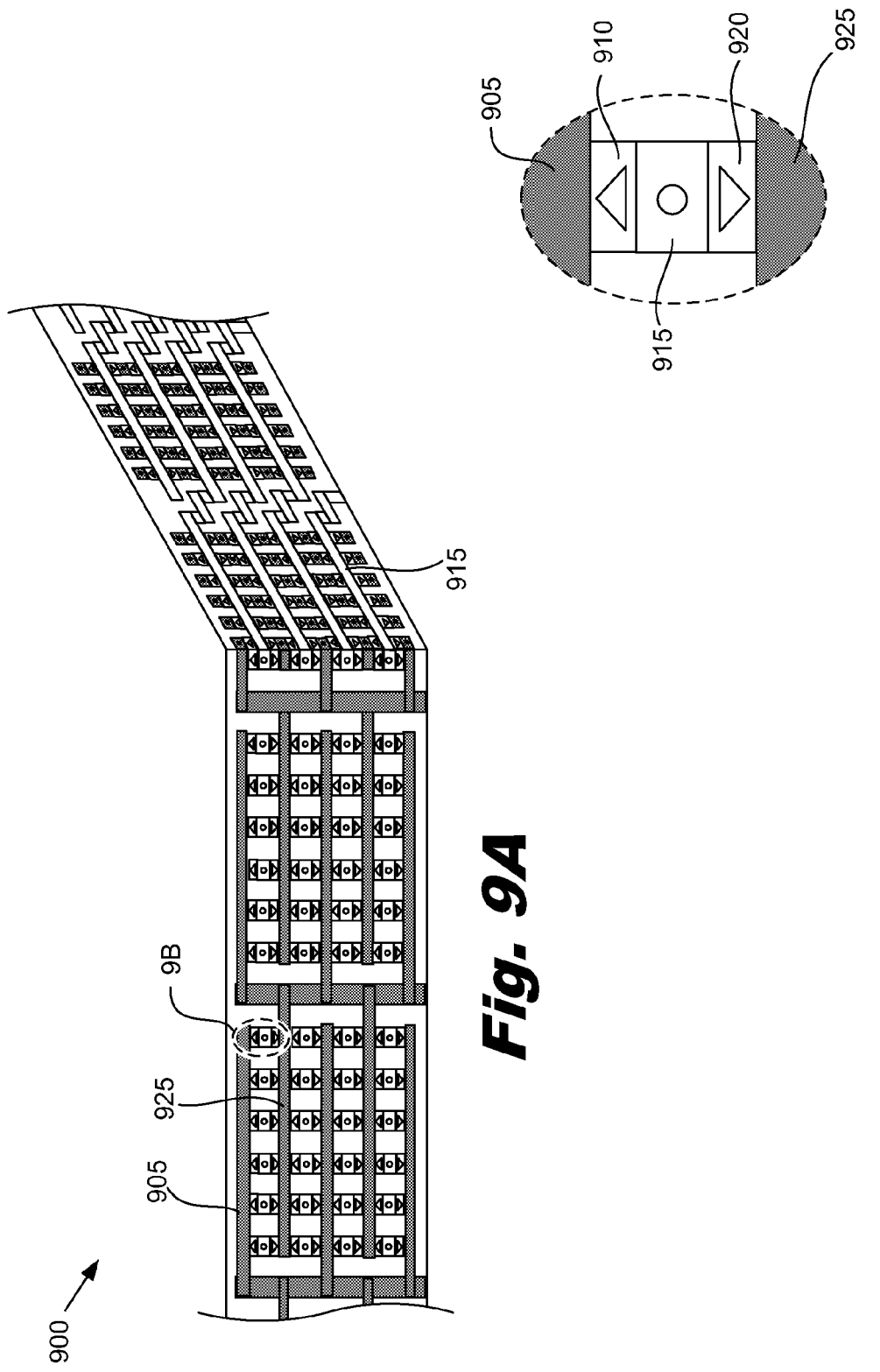
FIGS. 9A and 9B are diagrams of an illustrative extensible three dimensional circuit with a double density configuration, according to one embodiment of principles described herein.

The designs which are illustrated and described above are only illustrative embodiments of possible circuit configurations. A variety of other configurations could be used. For example, FIGS. 9A and 9B are diagrams of an illustrative extensible three dimensional circuit (900) with a double-density configuration. As discussed above, the pillar lines (905, 925) extend alternatively to either side of the central pillar. The traveling lines (915) pass between the upper pillar lines (905) and the lower pillar lines (925). As shown in FIG. 9B, a first memristive device (910) is formed between an upper pillar line (905) and a traveling line (915). The second memristive device (920) is formed between a lower pillar line (925) and the traveling line (915). This double density configuration increases the number of programmable crosspoint devices by a factor of two for a given area and number of row or column line sublayers.

Programmable crosspoint devices can be formed with a polarity. In some embodiments, a polarized crosspoint device may exhibit diode like behavior which allows a flow of electrical current in a forward direction, but substantially prevents the flow of current in a reverse direction. This diode like characteristic can be utilized to reduce reverse leakage currents which interfere with reading operations.

In this illustrative embodiment, the first memristive device (910) has a polarity indicated by the superimposed triangle. The polarity of the first memristive device (910) allows current to flow from the traveling line (915) to the upper pillar line (905) but prevents the flow of current in the opposite direction. The opposite polarity of the second memristive device (920) allows the flow of current from the traveling line (915) to the lower pillar line (925) but prevents the flow of current in the opposite direction. This alternating polarity allows all memory elements to appear to be of the same polarity on any given row or column line. However, other techniques of handling two different polarities of memory element on the same row or column line are possible, if handled within the active circuit layer.

Figure 10:
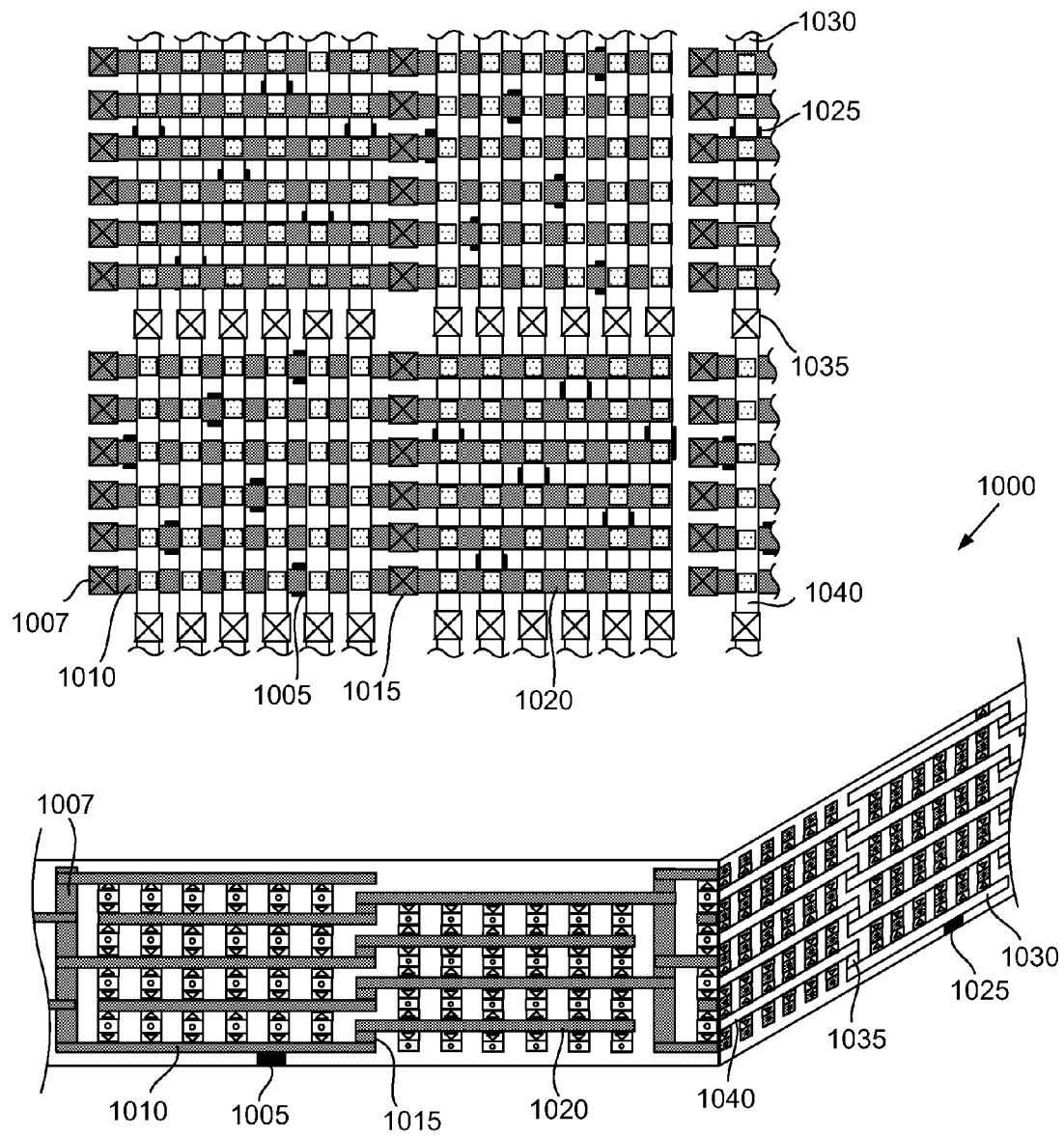
FIG. 10 is a diagram of an illustrative extensible three dimensional circuit with distributed bottom via connections, according to one embodiment of principles described herein.

FIG. 10 is a diagram of an illustrative extensible three dimensional circuit (1000) which is configured to facilitate distributed bottom via connections to the access layer without requiring a dedicated one-time translation routing layer. FIG. 10 is similar to the embodiment illustrated in FIG. 9 and includes a "double density" form. As discussed above with respect to FIG. 4, area distributed CMOS access gates with an efficient packing distribution may not be in the optimal location to connect to the overlying lines. FIG. 4 described a single metal routing layer which connected the area distributed access gates to line vias in the desired location to form the overlying mini-arrays. FIG. 10 presents an illustrative embodiment in which a section of each of the pillar and traveling lines is exposed to the bottom access layer. The traveling lines have two sections (1030, 1040) connected by an inter-via (1035). In this embodiment, the pillar lines (1007) extend in two sections, a lower section (1010) and an upper section (1020). These two sections (1010, 1020) are connected by an inter-via (1015). Thus vertical vias (1005, 1025) can be extended upward from the access gates to locations anywhere along the bottom section of each column and row lines. This can eliminate the need for a separate wiring layer while still providing flexibility in arranging the access gates in the CMOS layer.

Thus, a unique aspect of this design is that all lines connect to some amount of first-layer-metal trace. That means that all via connections to the access gates in the active circuit layer can be spread out somewhat and still be directly connected to the lines by vertical vias (1005, 1025).

Figure 11:
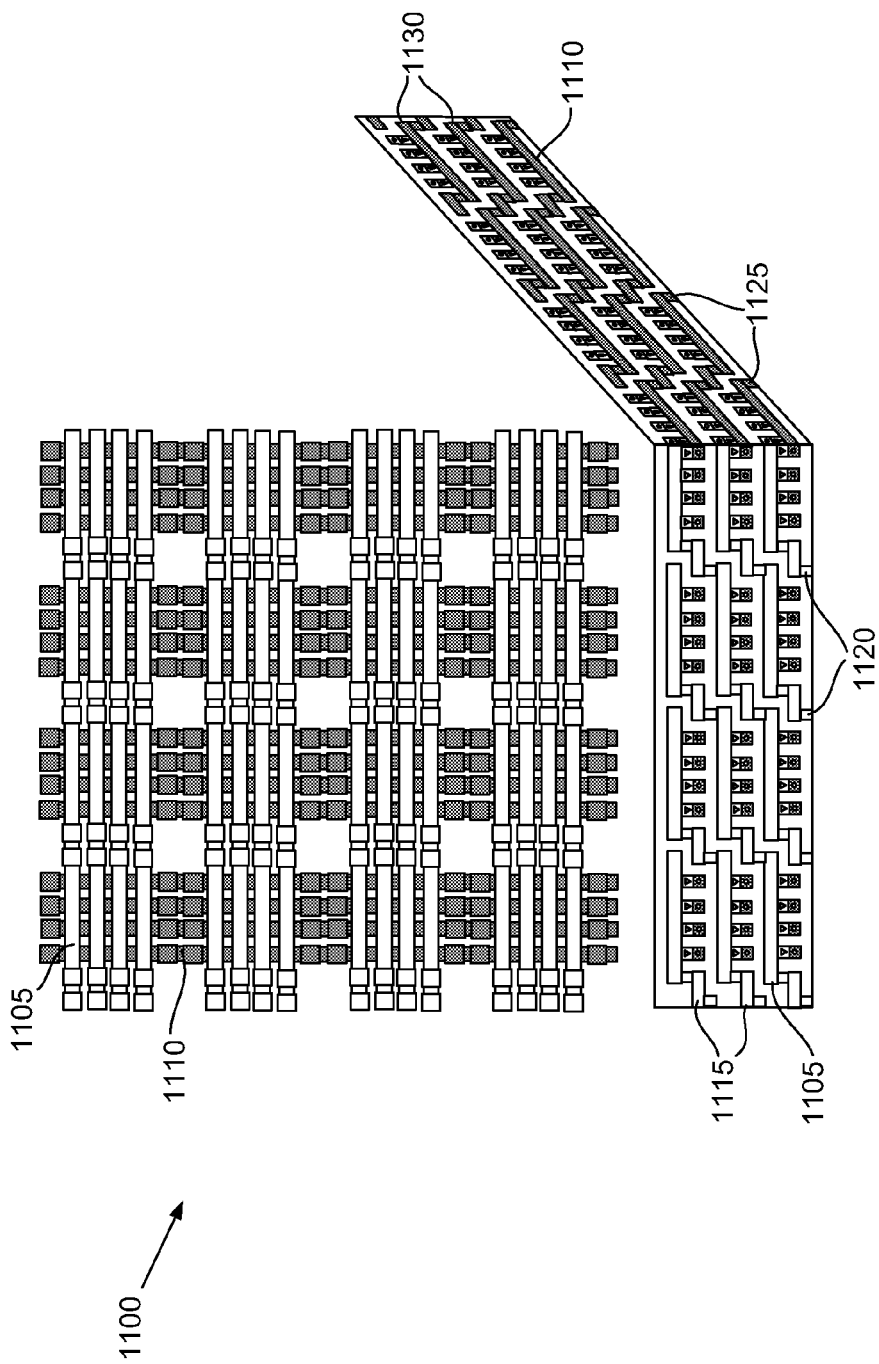
FIG. 11 is a diagram of an illustrative extensible three dimensional circuit in which both row and column lines travel, according to one embodiment of principles described herein.

FIG. 11 is a diagram of an illustrative extensible three dimensional circuit (1100) in which both row lines (1105) and column lines (1110) travel. Like any design with traveling lines, until loopback connections are provided, there may be undriven lines (1115, 1130) or underutilized lines (1120, 1125).

Figure 12:
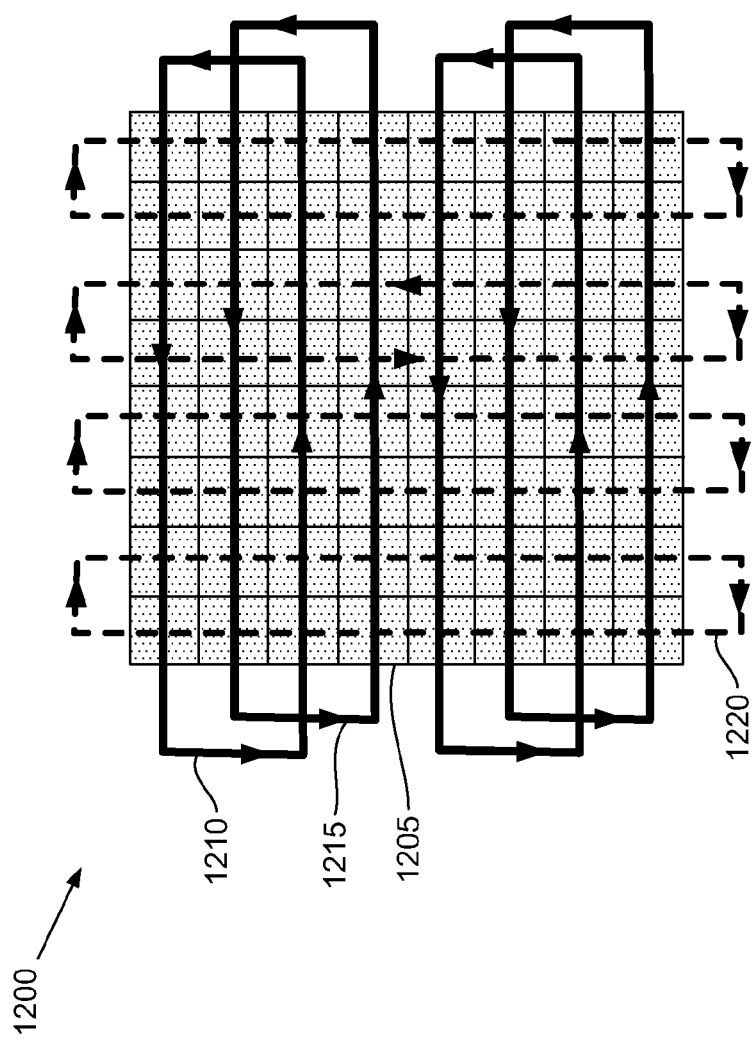
FIG. 12 is a diagram of illustrative loopback connections for an extensible three dimensional circuit in which both row and column lines travel, according to one embodiment of principles described herein.

FIG. 12 is a diagram of illustrative loopback connections for an extensible three dimensional circuit (1200) in which both row and column lines travel as shown in FIG. 11. As discussed above, the footprint of the circuit and the tiled mini-arrays are shown as a grid (1205). The groups of traces which travel north and south are interconnected by a first group of loopback traces (1220). The lines which travel east and west are interconnected by a two groups of loopback traces (1210, 1215). This connects the underutilized lines with undriven lines and provides complete addressing space for the circuit. In this illustrative example, a maximum of 16 array layers is supported before unique crosspoint element addressing is no longer possible.

In sum, the designs include small rectangular mini-arrays with traveling row and/or column lines. The designs are extensible with simple addressing and edge effects that can be handled by a variety of direction-reversing techniques and loopback traces. The designs are also amenable to "double density" techniques. At least one class of access vias can always be spread out evenly, namely the class that drives traces on the lowest metal layer. For these designs, connections between a second class of access vias can be made using a one-time-only translation layer. These principles provide a superior interconnection architecture which resolves edge effects and reduces connection complexity.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. An extensible three dimensional circuit comprising:
an access layer;
crossbar arrays overlying the access layer and being electrically accessed by the access layer, the crossbar arrays being formed from tiled mini-arrays of crossing lines, the crossing lines comprising at least one bundle of traveling lines, the at least one bundle of traveling lines moving through the circuit both laterally and vertically, and
programmable crosspoint devices disposed between the crossing lines.

2. The circuit of claim 1, in which the crossing lines comprise pillar lines and travelling lines.

3. The circuit of claim 1, further comprising loopback traces which attach to a bundle of traveling lines at a peripheral edge of the circuit and form electrical paths which direct the traveling lines back into the circuit.

4. The circuit of claim 3, in which bundles of traveling lines travel in at least two opposite directions through the circuit, the loopback traces connecting a first bundle of traveling lines moving in a first direction to a second bundle of traveling lines moving in an opposite direction.

5. The circuit of claim 4, in which loopback traces connect the first bundle of traveling lines moving in a first direction to an immediately adjacent second bundle of traveling lines moving in an opposite direction.

6. The circuit of claim 4, in which at least a portion of the loopback traces connect the first bundle of traveling lines moving in a first direction to a nonadjacent bundle of traveling lines.

7. The circuit of claim 4, in which the loopback traces are configured to create a double overlapping folded loop such that a first group of traveling lines interacts with each group of pillar lines in the circuit.

8. The circuit of claim 1, in which the traveling lines further comprise redundant electrical connections within a single mini-array.

9. The circuit of claim 1, in which two programmable crosspoint devices are paired to form a double density configuration.

10. The circuit of claim 1, further comprising a single routing layer, the single routing layer connecting area-distributed access gates in the access layer to vias connecting to overlying crossing lines, the vias to overlying crossing lines being arranged in a different geometric pattern than the area-distributed access gates.

11. The circuit of claim 1, in which a bottommost segment of each traveling line is directly accessible along its length to vias extending upward from area-distributed access gates in the access layer.

12. The circuit of claim 11, in which each pillar line extends into at least two different layers, the bottommost segment of at least one pillar line for each pillar being directly accessible along its length to vias extending upward from area-distributed access gates in the access layer.

13. The circuit of claim 1, in which the crossing lines comprise row lines and column lines; in which both the row and column lines travel through the circuit both laterally and vertically.

14. The circuit of claim 13, further comprising loopback connections which are made on at least four sides of the circuit.

15. The circuit of claim 13, in which row lines are connected in a many-overlapping-loops configuration and column lines are connected in a many-loops configuration.

* * * * *